United States Patent
Shibata (12)

(10) Patent No.: US 6,330,201 B2
(45) Date of Patent: *Dec. 11, 2001

(54) SEMICONDUCTOR MEMORY DEVICE EXHIBITING IMPROVED HIGH SPEED AND STABLE WRITE OPERATIONS

(75) Inventor: Kayoko Shibata, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/314,156

(22) Filed: May 19, 1999

(30) Foreign Application Priority Data

May 19, 1998 (JP) ................................. 10-137255

(51) Int. Cl.[7] ..................................... G11C 7/00
(52) U.S. Cl. ......................... 365/203; 365/190; 365/233
(58) Field of Search ............................. 365/203, 189.01, 365/190, 233

(56) References Cited

U.S. PATENT DOCUMENTS

| | | | |
|---|---|---|---|
| 5,267,197 | * 11/1993 | McClure | 365/189.01 |
| 5,416,743 | * 5/1995 | Allan et al. | 365/203 |
| 5,625,601 | * 4/1997 | Gillingham et al. | 365/200 |
| 5,642,314 | 6/1997 | Yamauchi. | |
| 5,650,980 | 7/1997 | Sakurai et al. . | |
| 5,742,185 | * 4/1998 | Le | 326/86 |
| 5,936,897 | * 10/1999 | Koga | 365/190 |

FOREIGN PATENT DOCUMENTS

| | | |
|---|---|---|
| 0 788 107 | 8/1997 | (EP) . |
| 8-111093 | 4/1996 | (JP) . |
| 9213076 | 8/1997 | (JP) . |
| 11273350 | 10/1999 | (JP) . |

* cited by examiner

*Primary Examiner*—Hoai V. Ho
(74) *Attorney, Agent, or Firm*—Young & Thompson

(57) ABSTRACT

The present invention provides a circuitry for supplying data from a write input/output line pair to a digit line pair for writing the data into memory cells. The circuitry comprises: a balancing device for balancing in voltage level between the write input/output line pair by making a connection of the write input/output line pair; and a controller connected to the balancing device for controlling balancing operations of the balancing device.

9 Claims, 7 Drawing Sheets

SEMICONDUCTOR MEMORY DEVICE EXHIBITING IMPROVED HIGH SPEED AND STABLE WRITE OPERATIONS

BACKGROUND OF THE INVENTION

The present invention relates to a semiconductor memory device, and more particularly to a semiconductor memory device synchronizing with a clock signal and exhibiting a high speed and stable write operation.

Various kinds of the semiconductor memory devices have been known in the art to which the present invention pertains. The most important issues for the semiconductor memory devices are how to improve the data write operation speed and shorten the necessary time for the completion of the data write operation as well as improve the stability in data write operation.

SUMMARY OF THE INVENTION

Accordingly, it is an object of the present invention to provide a novel semiconductor memory device exhibiting a high speed data write operation.

It is a further object of the present invention to provide a novel semiconductor memory device exhibiting a stable data write operation.

The first present invention provides a circuitry for supplying data from a write input/output line pair to a digit line pair for writing the data into memory cells. The circuitry comprises: a balancing device for balancing in voltage level between the write input/output line pair by making a connection of the write input/output line pair; and a controller connected to the balancing device for controlling balancing operations of the balancing device.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
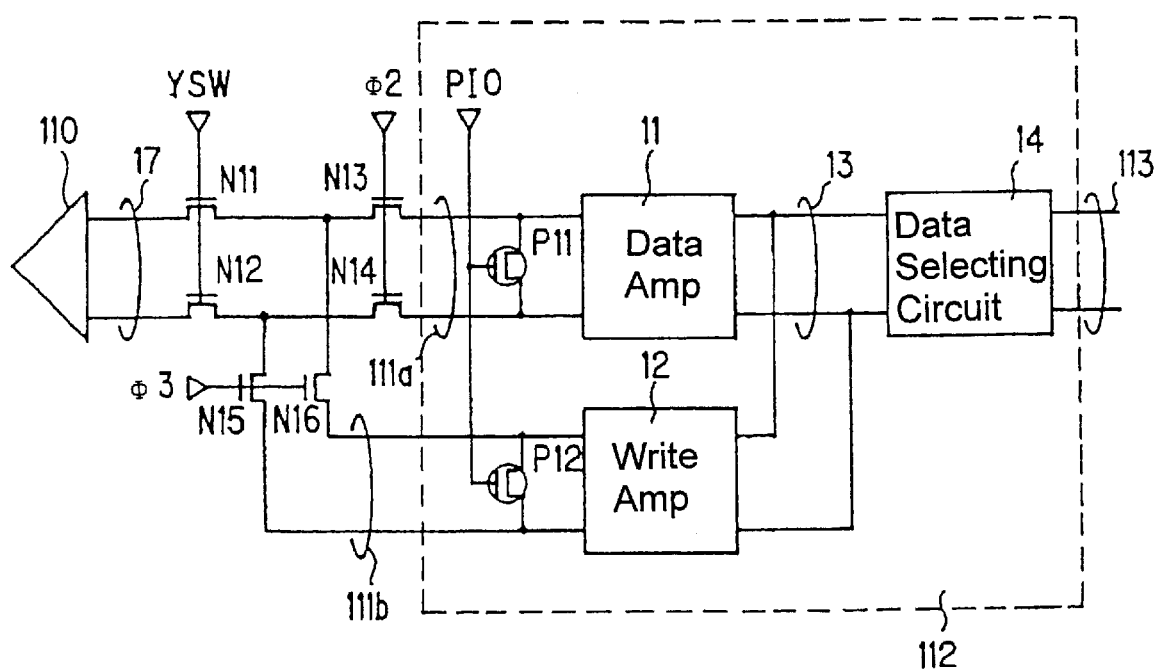
FIG. 1 is a circuit diagram illustrative of a novel semiconductor memory device in a first embodiment in accordance with the present invention.

The first present invention provides a circuitry for supplying data from a write input/output line pair to a digit line pair for writing the data into memory cells. The circuitry comprises: a balancing device for balancing in voltage level between the write input/output line pair by making a connection of the write input/output line pair; and a controller connected to the balancing device for controlling balancing operations of the balancing device.

It is preferable that the write input/output line pair is connected through a switch to the digit line pair, so that the controller operates the balancing device immediately before the switch turns ON.

It is also preferable that the controller operates the balancing device in synchronizing with clock signals throughout the write operation.

It is also preferable that the balancing device comprises at least one transistor provided on the write input/output line pair, so that the controller supplies the balancing signal to a gate of the transistor.

It is also preferable that the transistor comprises a p-MOS transistor and the controller supplies a low level balancing signal to the gate of the p-MOS transistor.

In accordance with the first present invention, a pair of write I/O lies are balanced before a pair of write I/O lines are made connected to a pair of digit lines through transfer gates, so that the write I/O lines are changed to the write data level in a short time, whereby the write operations are improved in write operation speed and stability.

The second present invention provides a circuitry for supplying data from a write input/output line pair to a digit line pair for writing the data into memory cells and for reading data from the memory cells to transmit the data through the digit line pair to a read out input/output line pair. The circuitry comprises: a first balancing device for balancing in voltage level between the write input/output line pair by making a connection of the write input/output line pair; a second balancing device for balancing in voltage level between the read out input/output line pair by making a connection of the read out input/output line pair; and a controller connected to the first and second balancing devices for controlling balancing operations of the first and second balancing devices.

It is also preferable that the write input/output line pair and the read out input/output line pair are connected through a common switch to the digit line pair, so that the controller operates the first and second balancing device immediately before the switch turns ON.

In accordance with the first present invention, a pair of write I/O lies are balanced before a pair of write I/O lines are made connected to a pair of digit lines through transfer gates, so that the write I/O lines are changed to the write data level in a short time, whereby the write operations are improved in write operation speed and stability.

The third present invention provides a circuitry for supplying data from a write input/output line pair to a digit line pair for writing the data into memory cells and for reading data from the memory cells to transmit the data through the digit line pair to a read out input/output line pair. The circuitry comprises: a common balancing device for balancing in voltage level between the write input/output line pair by making a connection of the write input/output line pair and also for balancing in voltage level between the read out input/output line pair by making a connection of the read out input/output line pair; and a controller connected to the common balancing device for controlling balancing operations of the common balancing device.

In accordance with the first present invention, a pair of write I/O lies are balanced before a pair of write I/O lines are connected to a pair of digit lines through transfer gates, so that the write I/O lines are changed to the write data level in a short time, whereby the write operations are improved in write operation speed and stability.

A first embodiment according to the present invention will be described in detail with reference to the drawings. FIG. 1 is a circuit diagram illustrative of a novel semiconductor memory device in a first embodiment in accordance with the present invention. The novel semiconductor memory device has a sense amplifier 110 and a data control circuit 112. The sense amplifier 110 and the data control circuit 112 are connected to each other through a pair of digit lines 17 and a pair of RI/O lines 111a and a pair of WI/O lies 111b. Transistors N11 and N12 are provided on the digit lines 17. The transistors N11, N12 have gates receiving column address selecting signals YSW. Transfer gate transistors N13 and N14 are provided on the RI/O lines 111a. The transfer gate transistors N13 and N14 have gates receiving Φ2 signals which become high level when reading out operation. Transfer gate transistors N15 and N16 are provided on the WI/O lines 111a. The transfer gate transistors N13 and N14 have gates receiving Φ3 signals which become high level when write operation.

The data control circuit 112 has p-channel transistors P11 and P12, a data amplifier 11, a write amplifier 12, a pair of read-write buses 13 and a data selecting circuit 14. The p-channel transistor P11 balances the RI/O lines 111a by a balance control signal PIO. The p-channel transistor P12 balances the WI/O lines 111b by the balance control signal PIO.

Figure 2:
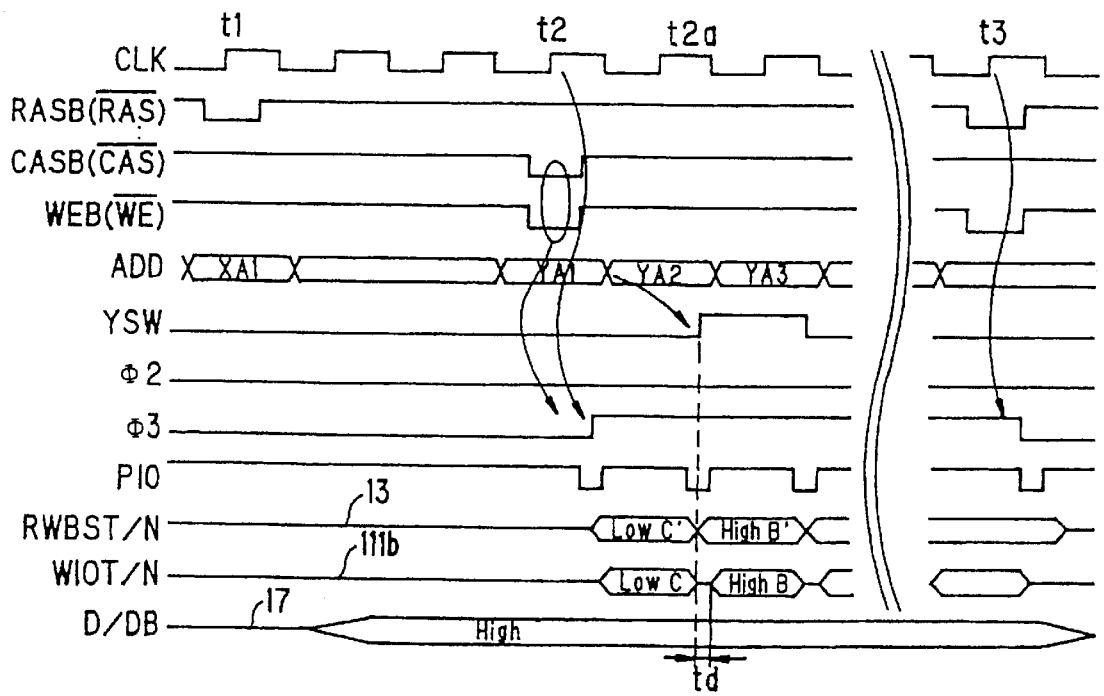
FIG. 2 is a timing chart of write operation of the above novel semiconductor memory device.

FIG. 2 is a timing chart of write operation of the above novel semiconductor memory device. An active command is inputted at a time t1. The active command is a combination signal for making RASB input and CSB inputs into the low level. At this time, a row address is decided by an XA1 of an ADD signal. A write command is a combination signal for making CASB input and WEB input into the low level. At a time t2, the write command is inputted, whereby the Φ3 signal becomes high level. At this time, the column address is also inputted. This address corresponds to YA1 of the ADD signal and is latched at rising edge of the clock signal at t2. YA2, YA3—are addresses outputted from an address burst counter and are latched at successive rising edges. At the time t3, the write operation is finished. At this time, pre-charge commands RASB, WEB and CSB in low level are inputted, whereby the Φ3 signal becomes low level. A PIO signal is for balancing the I/O lines 111a and also balancing the I/O lines 111b. The PIO signal is generated in synchronizing with the clock signal CLK, whereby a shot type signal is outputted. During when the PIO signal is in the low level, the balancing operations to the I/O lines 111a and the I/O lines 111b are carried out, so that paired TRUE line and NOT line are connected to make the TRUE line and NOT line into the same level, wherein the TRUE line and NOT line have reversed data from each other, whereby switching data on the I/O lines 111a and the I/O lines 111b can securely be carried out. In synchronizing with the rising of the Φ3 signal, the PIO signal becomes low level, whereby the transistor P12 turns ON to carry out a balancing operation to the WI/O lines 111b. Accesses to other memory cells are made in accordance with addresses signal for writing the low level data into the designated memory cells. Those data remain as "C'" on the RWBS lines 13 and as "C" on the WI/O lines 111b. Thereafter, PIO signal becomes low level, whereby the transistor P12 turns ON to carryout the balancing operation to the WI/O lines 111b. As a result, the low level data "C" become disappeared from the WI/O lines 111b. Accesses are made to those memory cells in accordance with the address signals XA1 and YA2 high level data "B'" are transferred from the RWBS lines 13 to supply the high level data "B" onto the WI/O lines 111b with a time delay "td". Prior to this, the YSW signal becomes high level, whereby the transistors N11 and N12 turn ON. Even the transistors N11 and N12 have turned ON, the data "C" disappeared from the WI/O lines 111b, for which reason the digit lines 17 sustain data "A" in high level which have already been stored in the memory cells. The data "B" in the high level on the WI/O lines 111b are transferred through the digit lines 17 to the transistors N15 and N16 and then amplified by the sense amplifier 110 before the amplified data are written into the memory cells. It is unnecessary to set the write complete time "tw".

Figure 3:
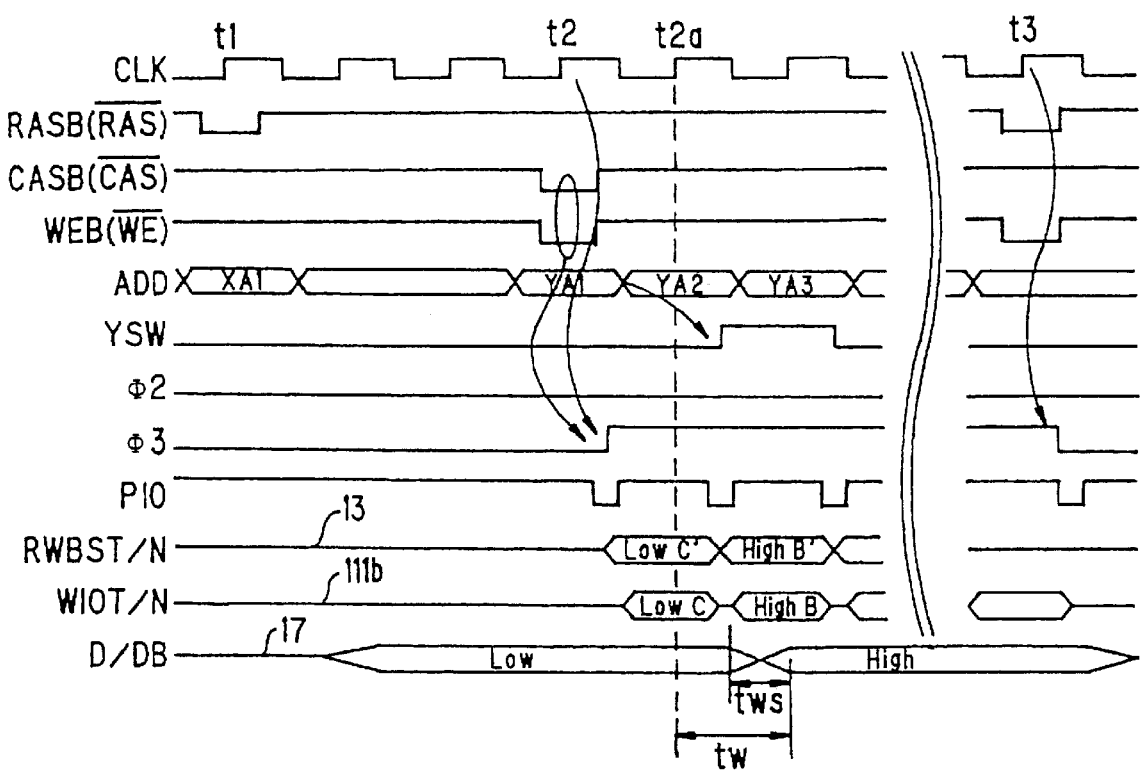
FIG. 3 is a timing chart of write operation of the above novel semiconductor memory device.

FIG. 3 is a timing chart of write operation of the above novel semiconductor memory device. The write operations of FIG. 3 is different from the write operations of FIG. 2 but only in that data stored in the memory cells are low level and low level data "A" exist on the digit lines 17. The data "A" of the low level on the digit lines 17 are made disappeared by the high level data "B" which appear on the WI/O lines 111b with the time delay "td", whereby the data "A" becomes high level data in a short time "tws". This means that the necessary time for completing the write operations is shortened.

In accordance with the first present invention, a pair of write I/O lies are balanced before a pair of write I/O lines are connected to a pair of digit lines through transfer gates, so that the write I/O lines are changed to the write data level in a short time, whereby the write operations are improved in write operation speed and stability.

Figure 4:
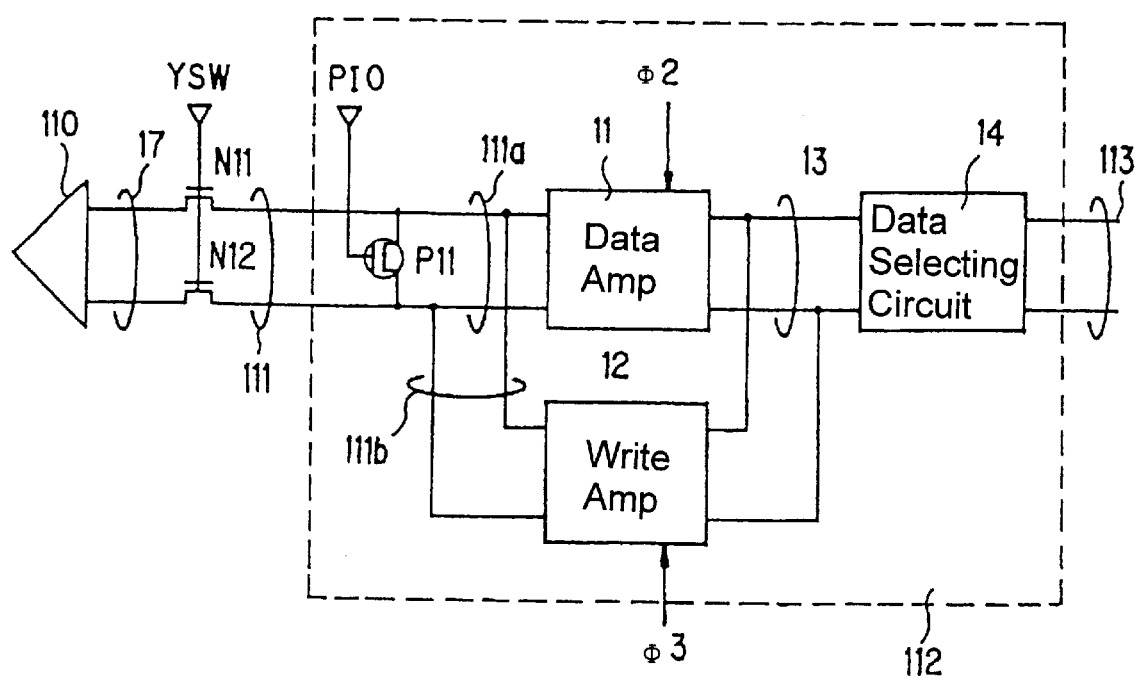
FIG. 4 is a circuit diagram illustrative of a second novel semiconductor memory device in a second embodiment in accordance with the present invention.

FIG. 4 is a circuit diagram illustrative of a second novel semiconductor memory device in a second embodiment in accordance with the present invention. The differences of this second novel semiconductor memory device from the above first novel semiconductor memory device is in that the transistor P11 is used for balancing not only the paired RI/O lines 111a but also the paired WI/O lines 111b.

The second novel semiconductor memory device has a sense amplifier 110 and a data control circuit 112. The sense amplifier 110 and the data control circuit 112 are connected to each other through a pair of digit lines 17 and a pair of RI/O lines 111a and a pair of WI/O lies 111b. Transistors N11 and N12 are provided on the digit lines 17. The transistors N11 have gates receiving column address selecting signals YSW.

The data control circuit 112 has a p-channel transistor P11, a data amplifier 11, a write amplifier 12, a pair of read-write buses 13 and a data selecting circuit 14. The p-channel transistor P11 balances the RI/O lines 111a by a balance control signal PIO. The p-channel transistor P11 balances the WI/O lines 111b by the balance control signal PIO.

Figure 5:
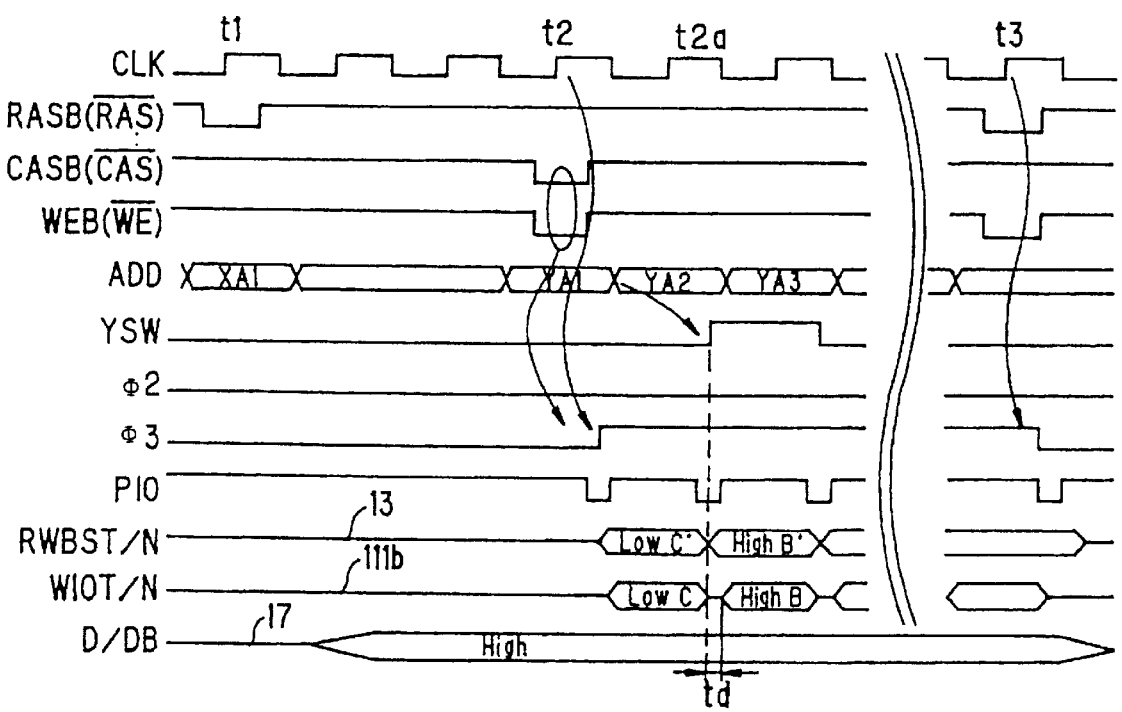
FIG. 5 is a timing chart of write operation of the above novel semiconductor memory device.

FIG. 5 is a timing chart of write operation of the above novel semiconductor memory device. An active command is inputted at a time t1. The active command is a combination signal for making RASB input and CSB inputs into the low level. At this time, a row address is decided by an XA1 of an ADD signal. A write command is a combination signal for making CASB input and WEB input into the low level. At a time t2, the write command is inputted, whereby the Φ3 signal becomes high level. At this time, the column address is also inputted. This address corresponds to YA1 of the ADD signal and is latched at rising edge of the clock signal at t2. YA2, YA3—are addresses outputted from an address burst counter and are latched at successive rising edges. At the time t3, the write operation is finished. At this time, pre-charge commands RASB, WEB and CSB in low level are inputted, whereby the Φ3 signal becomes low level. A PIO signal is for balancing the I/O lines 111a and also balancing the I/O lines 111b. The PIO signal is generated in synchronizing with the clock signal CLK, whereby a shot type signal is outputted. During when the PIO signal is in the low level, the balancing operations to the I/O lines 111a and the I/O lines 111b are carried out, so that paired TRUE line and NOT line are connected to make the TRUE line and NOT line into the same level, wherein the TRUE line and NOT line have reversed data from each other, whereby switching data on the I/O lines 111a and the I/O lines 111b can securely be carried out. In synchronizing with the rising of the Φ3 signal, the PIO signal becomes low level, whereby the transistor P11 turns ON to carry out a balancing operation to the WI/O lines 111b. Accesses to other memory cells are made in accordance with addresses signal for writing the low level data into the designated memory cells. Those data remain as "C'" on the RWBS lines 13 and as "C" on the WI/O lines 111b. Thereafter, PIO signal becomes low level, whereby the transistor P11 turns ON to carryout the balancing operation to the WI/O lines 111b. As a result, the low level data "C" become disappeared from the WI/O lines 111b. Accesses are made to those memory cells in accordance with the address signals XA1 and YA2 high level data "B'" are transferred from the RWBS lines 13 to supply the high level data "B" onto the WI/O lines 111b with a time delay "td". Prior to this, the YSW signal becomes high level, whereby the transistors N11 and N12 turn ON. Even the transistors N11 and N12 have turned ON, the data "C" disappeared from the WI/O lines 111b, for which reason the digit lies 17 sustain data "A" in high level which have already been stored in the memory cells. The data "B" in the high level on the WI/O lines 111b are transferred through the digit lines 17 to the transistors N15 and N16 and then amplified by the sense amplifier 110 before the amplified data are written into the memory cells. It is unnecessary to set the write complete time "tw".

Figure 6:
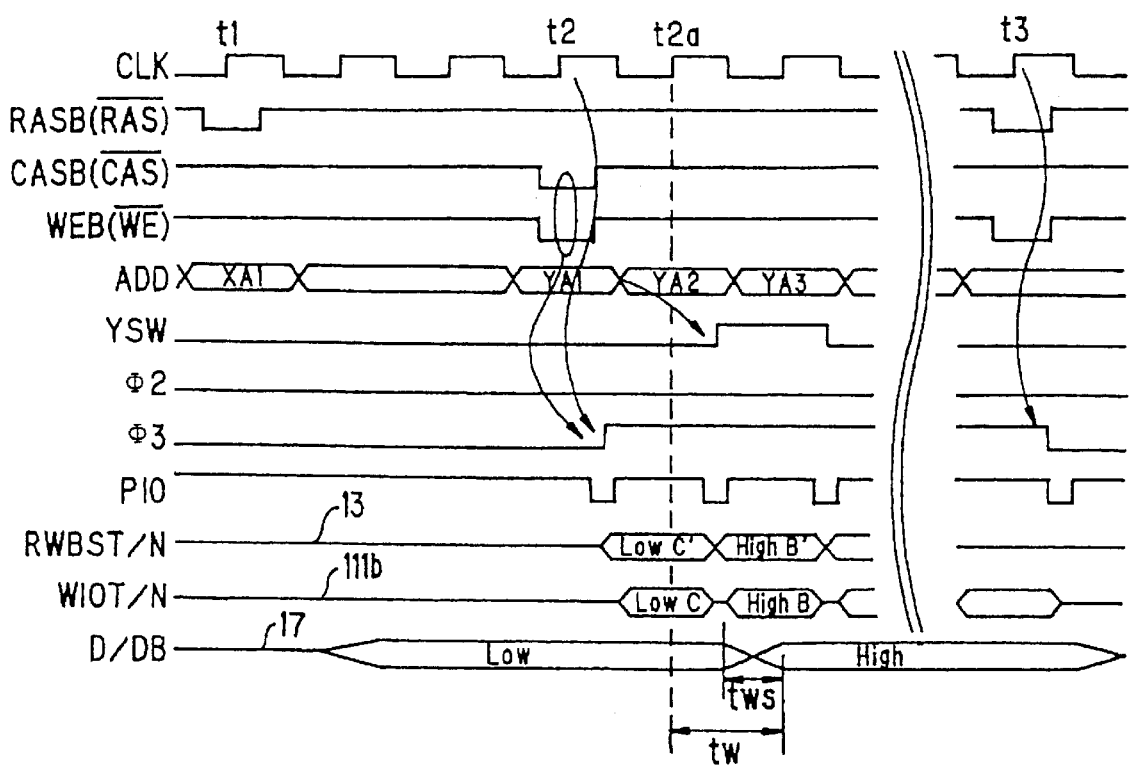
FIG. 6 is a timing chart of write operation of the above novel semiconductor memory device.

FIG. 6 is a timing chart of write operation of the above novel semiconductor memory device. The write operations of FIG. 3 is different from the write operations of FIG. 5 but only in that data stored in the memory cells are low level and low level data "A" exist on the digit lines 17. The data "A" of the low level on the digit lines 17 are made disappeared by the high level data "B" which appear on the WI/O lines 111b with the time delay "td", whereby the data "A" becomes high level data in a short time "tws". This means that the necessary time for completing the write operations is shortened.

The WI/O lines 111b are changed from the low level to a balanced level which lies an intermediate level between the high and low levels, before the balanced level is then changed to the high level. The balancing operation is carried out by utilizing the delay time "td" which is essentially caused. For this reason, it is unnecessary to set an additional or special time for balancing operations. After the low level data have been written into the other memory cells, then the high level data are written into the same memory cells. In this case, the WI/O lines are changed from the balance level to the high level, for which reason the necessary time for changing the level is reduced into a half of the necessary time for changing the low level to the high level.

In accordance with the second present invention, a pair of write I/O lies are balanced before a pair of write I/O lines are made connected to a pair of digit lines through transfer gates, so that the write I/O lines are changed to the write data level in a short time, whereby the write operations are improved in write operation speed and stability.

Figure 7:
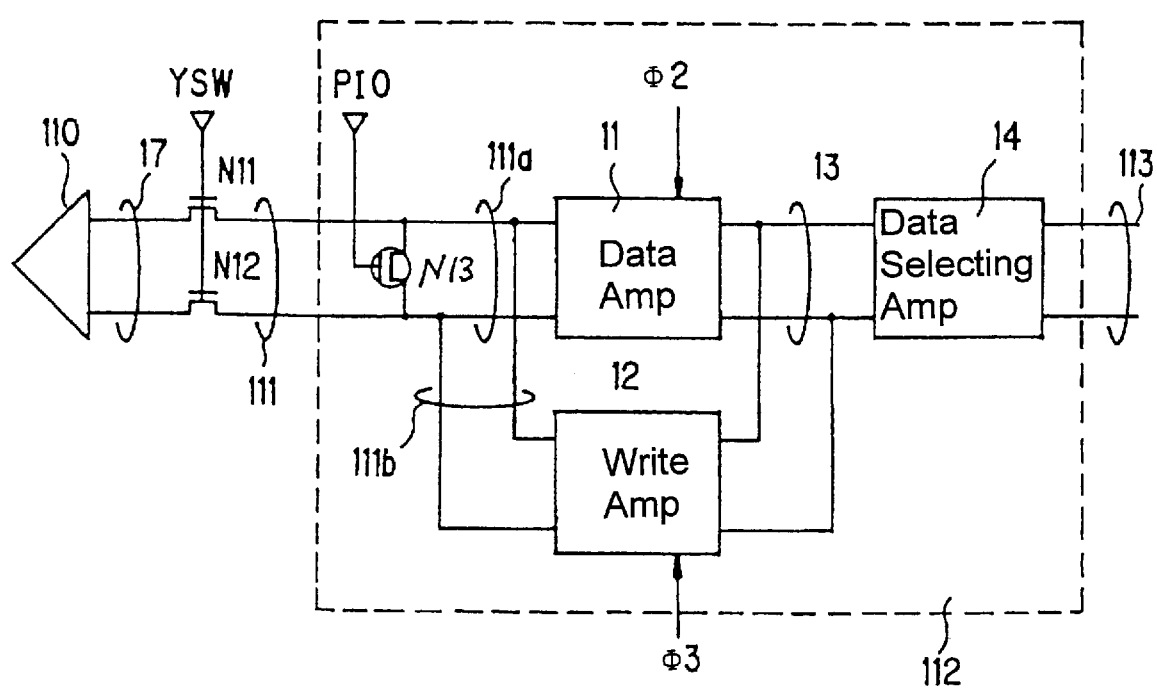
FIG. 7 is a circuit diagram illustrative of a third novel semiconductor memory device in a third embodiment in accordance with the present invention.

FIG. 7 is a circuit diagram illustrative of a third novel semiconductor memory device in a third embodiment in accordance with the present invention. A difference of the third novel semiconductor memory device from the second novel semiconductor memory device is only in replacing the transistor P11 by an n-channel transistor N13. The third novel semiconductor memory device has a sense amplifier 110 and a data control circuit 112. The sense amplifier 110 and the data control circuit 112 are connected to each other through a pair of digit lines 17 and a pair of RI/O lines 111a and a pair of WI/O lies 111b. Transistors N11 and N12 are provided on the digit lines 17. The transistor N11 has a gate receiving column address selecting signals YSW.

The data control circuit 112 has a p-channel transistor P11, a data amplifier 11, a write amplifier 12, a pair of read-write buses 13 and a data selecting circuit 14. The p-channel transistor P11 balances the RI/O lines 111a by a balance control signal PIO. The p-channel transistor P11 balances the WI/O lines 111b by the balance control signal PIO. The voltage levels of the PIO signal are reversed in phase from what is shown in FIGS. 2 and 3, so that the above third semiconductor memory device exhibits the same operations as shown in FIGS. 2 and 3.

In accordance with the third present invention, a pair of write I/O lies are balanced before a pair of write I/O lines are made connected to a pair of digit lines through transfer gates, so that the write I/O lines are changed to the write data level in a short time, whereby the write operations are improved in write operation speed and stability.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry for supplying data from a write amplifier through a write bus line pair to a digit line pair for writing said data into a memory cell and for reading out said data from said memory cell to supply said data from said digit line pair to a read out bus line pair, said circuitry comprising:

a pair of switching devices for selectively connecting said write bus line pair and said read out bus line pair to said digit line pair;

a first balancing device providing a first connection between lines of said write bus line pair to balance said write bus line pair by making equal a voltage level on each of the lines of said write bus line pair; and a controller connected to said first balancing device for sending a balancing signal to said first balancing device to start said balance operation at a timing immediately before said pair of switching device connect said write bus line pair to said digit line pair and balancing said write bus line pair by utilizing a period during which a signal of said data is transmitted from an input line pair of said write amplifier to said write bus line pair.

2. The circuitry as claimed in claim 1, wherein said controller controls said first balancing device in synchronizing with a clock signal.

3. The circuitry as claimed in claim 1, wherein said first balancing device comprises a first transistor being connected between said lines of said write bus line pair and having a gate connected to said controller for receiving said balancing signal.

4. The circuitry as claimed in claim 1, further comprising a second balancing device for providing a second connection between lines of said read out bus line pair to make voltage level equal to each other.

5. The circuitry as claimed in claim 4, wherein said controller is further connected to said second balancing device for sending said balancing signal to both said first and second balancing devices.

6. The circuitry as claimed in claim 5, wherein said second balancing device comprises a second transistor being connected between said lines of said read out bus line pair and having a gate connected to said controller for receiving said balancing signal.

7. A circuitry for supplying data from a write amplifier through a write bus line pair and a read/write common bus line pair to a digit line pair for writing said data into a memory cell and for reading out said data from said memory cell to supply said data from said digit line pair through said read/write common bus line pair to a read out bus line pair, said circuitry comprising:

a pair of switching devices for selectively connecting said read/write common bus line pair to said digit line pair;

a balancing device providing a connection between lines of said read/write common bus line pair to balance the lines of said read/write common bus line pair by making equal a voltage level on each of the lines of said read/write common bus line pair; and a controller connected to said balancing device for sending a balancing signal to said balancing device to start said balance operation at a timing immediately before said pair of switching devices connect said read/write common bus line pair to said digit line pair and balancing said read/write common bus line pair by utilizing a period during which a signal of said data is transmitted from an input line pair of said write amplifier to said write bus line pair.

8. The circuitry as claimed in claim 7, wherein said controller controls said balancing device in synchronizing with a clock signal.

9. The circuitry as claimed in claim 7, wherein said balancing device comprises a transistor being connected between said lines of said read/write common bus line pair and having a gate connected to said controller for receiving said balancing signal.

* * * * *